(12) United States Patent
Li et al.

(10) Patent No.: US 9,059,277 B2
(45) Date of Patent: Jun. 16, 2015

(54) RF LDMOS DEVICE AND FABRICATION METHOD THEREOF

(71) Applicant: SHANGHAI HUA HONG NEC ELECTRONICS CO., LTD., Shanghai (CN)

(72) Inventors: Juanjuan Li, Shanghai (CN); Wensheng Qian, Shanghai (CN); Feng Han, Shanghai (CN); Pengliang Ci, Shanghai (CN)

(73) Assignee: SHANGHAI HUA HONG NEC ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 13/956,588

(22) Filed: Aug. 1, 2013

(65) Prior Publication Data

US 2014/0042538 A1      Feb. 13, 2014

(30) Foreign Application Priority Data

Aug. 13, 2012   (CN) .......................... 2012 1 0287206

(51) Int. Cl.
| | |
|---|---|
| *H01L 29/78* | (2006.01) |
| *H01L 29/66* | (2006.01) |
| *H01L 29/08* | (2006.01) |
| H01L 29/40 | (2006.01) |
| H01L 29/417 | (2006.01) |
| H01L 29/10 | (2006.01) |

(52) U.S. Cl.
CPC ...... *H01L 29/7816* (2013.01); *H01L 29/66681* (2013.01); *H01L 29/402* (2013.01); *H01L 29/4175* (2013.01); *H01L 29/66659* (2013.01); *H01L 29/7835* (2013.01); *H01L 29/0847* (2013.01); *H01L 29/086* (2013.01); *H01L 29/1045* (2013.01)

(58) Field of Classification Search
CPC ................... H01L 29/66659; H01L 29/7835; H01L 29/1045; H01L 29/0847
USPC .......................................... 438/286; 257/328
See application file for complete search history.

(56) References Cited

U.S. PATENT DOCUMENTS

2002/0074612 A1 *   6/2002   Bulucea et al. ............... 257/402

\* cited by examiner

*Primary Examiner* — Monica D Harrison
(74) *Attorney, Agent, or Firm* — MKG, LLC

(57) ABSTRACT

A radio frequency (RF) laterally diffused metal oxide semiconductor (LDMOS) device is disclosed, wherein a lightly doped n-type drain region has a laterally non-uniform n-type dopant concentration distribution, which is achieved by forming a moderately n-type doped region, having a higher doping concentration and a greater depth than the rest portion of the lightly doped n-type drain region, in a portion of the lightly n-type doped region proximate to the polysilicon gate. The structure enables the RF LDMOS device of the present invention to have both a high breakdown voltage and a significantly reduced on-resistance. A method of fabricating such a RF LDMOS device is also disclosed.

13 Claims, 4 Drawing Sheets

RF LDMOS DEVICE AND FABRICATION METHOD THEREOF

CROSS-REFERENCE TO RELATED APPLICATIONS

This application claims the priority of Chinese patent application number 201210287206.8, filed on Aug. 13, 2012, the entire contents of which are incorporated herein by reference.

TECHNICAL FIELD

The present invention relates in general to semiconductor technology, and more particularly, to a radio frequency (RF) laterally diffused metal oxide semiconductor (LDMOS) device and fabrication methods thereof.

BACKGROUND

Radio frequency (RF) laterally diffused metal oxide semiconductor (LDMOS) device is a new generation integrated solid microwave power semiconductor device. It is a product of the combination of semiconductor integrated circuit technology and microwave electronics technology and has a variety of advantages such as high linearity, high gain, high voltage endurance, great output power, good thermal stability, high efficiency, good broadband matching property and high compatibility with MOS technology. Moreover, it is commercially available at a much lower price than gallium-arsenide (GaAs) devices. All of these advantages make the RF LDMOS device a very competitive power device that has been widely used as a power amplifier for Global System for Mobile communications (GSM), Personal Communications Service (PCS) and Wideband Code Division Multiple Access (W-CDMA) base stations and in wireless broadcasting, nuclear magnetic resonance (NMR) and many other applications.

Breakdown voltage (BV) and on-resistance Rdson are two key feature parameters for characterizing the performance of an RF LDMOS device. A high breakdown voltage ensures a high operational stability for the device. For example, an RF LDMOS having a working voltage of 50 V is typically required to have a breakdown voltage of not lower than 110 V. Moreover, the on-resistance Rdson of a RF LDMOS device is directly related to its output power, gain and other properties.

FIG. 1 shows a common RF LDMOS device. In the device, a p-type substrate 1 is covered by a p-type epitaxial 10. A p-type well 11 is formed in a left portion of the p-type epitaxial 10, and a lightly doped n-type drain region 12 is formed in a right portion of the p-type epitaxial 10. The p-type well 11 is not in contact with the lightly doped n-type drain region 12.

Moreover, a heavily doped n-type source region 24 is formed in an upper portion of the p-type well 11.

A heavily doped n-type drain region 21 is formed in a right portion of the lightly doped n-type drain region 12.

Both the heavily doped n-type source region 24 and the heavily doped n-type drain region 21 have a higher n-type dopant concentration than the lightly doped n-type drain region 12.

A contact column 13 is connected to a left edge of the p-type well 11.

The contact column 13 is further extending downwards into the p-type substrate 1.

A heavily doped p-type region 22 is formed in an upper portion of the p-type well 11 left to the heavily doped n-type source region 24. The heavily doped p-type region 22 is connected to the contact column 13 and has a higher p-type dopant concentration than the p-type well 11.

A gate oxide layer 14 is covering both an upper portion of the p-type well 11 right to the heavily doped n-type source region 24 and a portion of the p-type epitaxial 10 between the p-type well 11 and the lightly doped n-type drain region 12.

A polysilicon gate 15 is covering the gate oxide layer 14.

An oxide layer 16 is covering both the polysilicon gate 15 and a left portion of the lightly doped n-type drain region 12.

Furthermore, a right portion of the oxide layer 16 is covered by a Faraday shield 17.

In the RF LDMOS device with such a structure, the lightly doped n-type drain region 12 is generally formed in one single doping step. As the lightly doped n-type drain region 12 has a low dopant concentration, it can result in a high breakdown voltage BV. However, conflictingly, the low dopant concentration also leads to a great on-resistance Rdson.

SUMMARY OF THE INVENTION

The present invention seeks to enable a RF LDMOS device to have both a high breakdown voltage and a low on-resistance.

To achieve the above objective, there is provided a radio frequency (RF) laterally diffused metal oxide semiconductor (LDMOS) device. The device includes: a substrate; a p-type epitaxial layer on the substrate; a p-type well in a first portion of the p-type epitaxial layer; a lightly doped n-type drain region in a second portion of the p-type epitaxial layer and separated from the p-type well; a moderately doped n-type region in a first portion of the lightly doped n-type drain region and having a depth greater than a depth of the lightly doped n-type drain region; a heavily doped n-type drain region in a second portion of the lightly doped n-type drain region and separated from the moderately doped n-type region; and a heavily doped n-type source region in an upper portion of the p-type well, wherein an n-type dopant concentration of the moderately doped n-type region is lower than both n-type dopant concentrations of the heavily doped n-type drain region and the heavily doped n-type source region and is higher than or equal to an n-type dopant concentration of the lightly doped n-type drain region.

In one specific embodiment, the RF LDMOS device may further include: a gate oxide layer covering a portion of the p-type epitaxial layer between the heavily doped n-type source region and the lightly doped n-type drain region; a polysilicon gate covering the gate oxide layer; an oxide layer covering the polysilicon gate and a portion of the moderately doped n-type region; and a Faraday shield covering a portion of the oxide layer.

In another embodiment, a distance between the moderately doped n-type region and the polysilicon gate may be greater than or equal to 0.1 µm, and the depth of the moderately doped n-type region is 0.1 µm to 0.5 µm greater than that of the lightly doped n-type drain region.

In another specific embodiment, the RF LDMOS device may further include a contact column next to and in contact with a first edge of the p-type well, and the contact column extends downwards into the substrate.

To achieve the above objective, the present invention also provides a method of fabricating a radio frequency (RF) laterally diffused metal oxide semiconductor (LDMOS) device. The method may include the steps of: providing a substrate; forming a p-type epitaxial layer over the substrate; forming a p-type well in a first portion of the p-type epitaxial layer; forming a lightly doped n-type drain region in a second portion of the p-type epitaxial layer, the lightly doped n-type drain region being separated from the p-type well; forming a moderately doped n-type region in a first portion of the lightly doped n-type drain region, the moderately doped n-type region having a depth greater than a depth of the lightly doped n-type drain region; forming a heavily doped n-type drain region in a second portion of the lightly doped n-type drain region, the heavily doped n-type drain region being separated from the moderately doped n-type region; and forming a heavily doped n-type source region in an upper portion of the p-type well, wherein an n-type dopant concentration of the moderately doped n-type region is lower than both n-type dopant concentrations of the heavily doped n-type drain region and the heavily doped n-type source region and is higher than or equal to an n-type dopant concentration of the lightly doped n-type drain region.

In one embodiment, the method of fabricating a RF LDMOS device may specifically include the following steps in the sequence set forth: 1) growing a p-type epitaxial layer over a p-type substrate; 2) forming a p-type well in the p-type epitaxial layer; forming a gate oxide layer, a polysilicon gate, a lightly doped n-type drain region and a lightly doped n-type source region, the gate oxide layer covering a portion of the p-type well and a portion of the p-type epitaxial layer, the polysilicon gate covering the gate oxide layer, the lightly doped n-type source region being formed at least in a portion of the p-type well on a first side of the gate oxide layer, the lightly doped n-type drain region being formed in a portion of the p-type epitaxial layer on a second side of the gate oxide layer; 4) forming a moderately doped n-type region in a first portion of the lightly doped n-type drain region, the moderately doped n-type region having a depth greater than a depth of the lightly doped n-type drain region; 5) forming a heavily doped p-type region, a heavily doped n-type source region and a heavily doped n-type drain region, the heavily doped p-type region being formed in a first portion of the lightly doped n-type source region, the heavily doped n-type source region being formed in a second portion of the lightly doped n-type source region, the heavily doped n-type drain region being formed in a second portion of the lightly doped n-type drain region; and 6) forming an oxide layer, at least one Faraday shield and a contact column.

In another embodiment, the method may specifically include the following steps in the sequence set forth: 1) growing a p-type epitaxial layer over a p-type substrate; 2) forming a gate oxide layer, a polysilicon gate, a lightly doped n-type drain region and a lightly doped n-type source region, the gate oxide layer covering a portion of the p-type epitaxial layer, the polysilicon gate covering the gate oxide layer, the lightly doped n-type source region being formed in the p-type epitaxial layer and on a first side of the polysilicon gate, the lightly doped n-type drain region being formed in the p-type epitaxial layer and on a second side of the gate oxide layer; 3) forming a moderately doped n-type region in a first portion of the lightly doped n-type drain region, the moderately doped n-type region having a depth greater than a depth of the lightly doped n-type drain region; 4) forming a p-type well in the p-type epitaxial layer and under the lightly doped n-type source region; 5) forming a heavily doped p-type region, a heavily doped n-type source region and a heavily doped n-type drain region, the heavily doped p-type region being formed in a first portion of the lightly doped n-type source region, the heavily doped n-type source region being formed in a second portion of the lightly doped n-type source region, the heavily doped n-type drain region being formed in a second portion of the lightly doped n-type drain region; and 6) forming an oxide layer, at least one Faraday shield and a contact column.

As indicated above, the lightly doped n-type drain region of the present invention is a laterally non-uniform n-type dopant concentration distribution region, which is achieved by forming a moderately n-type doped region, having a higher doping concentration and a greater depth than the rest portion of the lightly doped n-type drain region, in a portion of the lightly n-type doped region proximate to the polysilicon gate. The laterally non-uniform concentration distribution of the lightly doped n-type drain region enables the RF LDMOS device of the present invention to have both a high breakdown voltage and a significantly reduced on-resistance by modification of the lateral doping concentration distribution in the lightly doped n-type drain region.

Moreover, in the RF LDMOS device fabrication method of the present invention, a second light n-type ion implantation additionally performed on a portion of the lightly doped n-type drain region proximate to the gate results in the formation of a moderately n-type doped region, which has a higher doping concentration and a greater depth than the rest portion of the lightly doped n-type drain region, proximate to the polysilicon gate. As this moderately n-type doped region is a certain distance away from the nearest edge of the polysilicon gate, it will not lead to the intensification of an electric field under the polysilicon gate and hence can enable the device to have a high breakdown voltage. In addition, as the moderately n-type doped region has a higher doping concentration and a greater depth, it can also enable the device to have a rather low on-resistance.

BRIEF DESCRIPTION OF THE DRAWINGS

Accompanying drawings for further describing principles of the present invention will be briefly described below. What is depicted by the accompanying drawings taken as reference in the following detailed description are only several non-limiting exemplary embodiments of the present invention. Those skilled in the art can make other similar drawings in light of the accompanying drawings without exerting creative efforts.

DETAILED DESCRIPTION OF THE INVENTION

Exemplary embodiments are described in detail below in conjunction with the accompanying drawings so that this disclosure will be thorough and fully understood. The embodiments described in detail herein are only some exemplary embodiments rather than all embodiments of the present invention. All other embodiments made without exerting creative efforts by those skilled in the art in light of principles of the exemplary embodiments are considered to be within the scope of the present invention.

Embodiment 1

Figure 1:
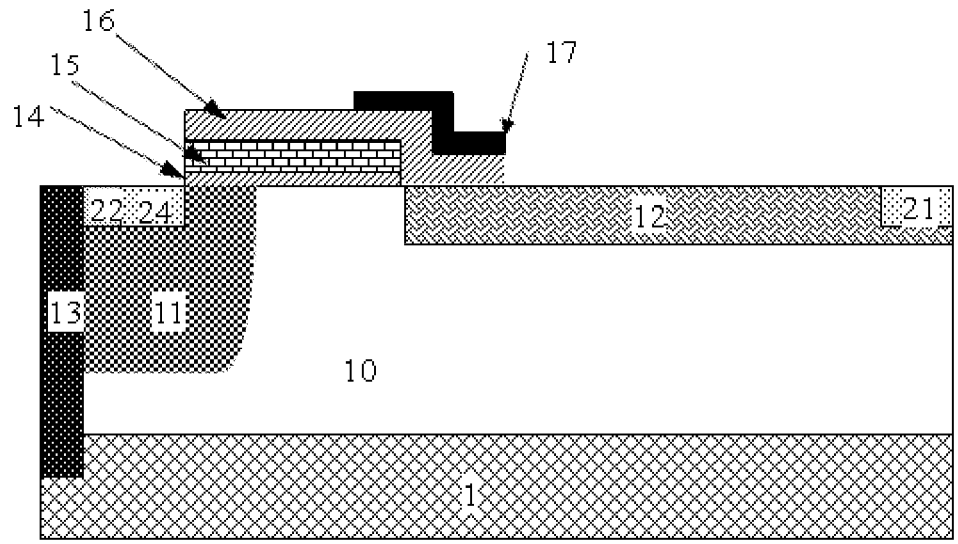
FIG. 1 shows a schematic illustration of an existing RF LDMOS device.
Figure 2:
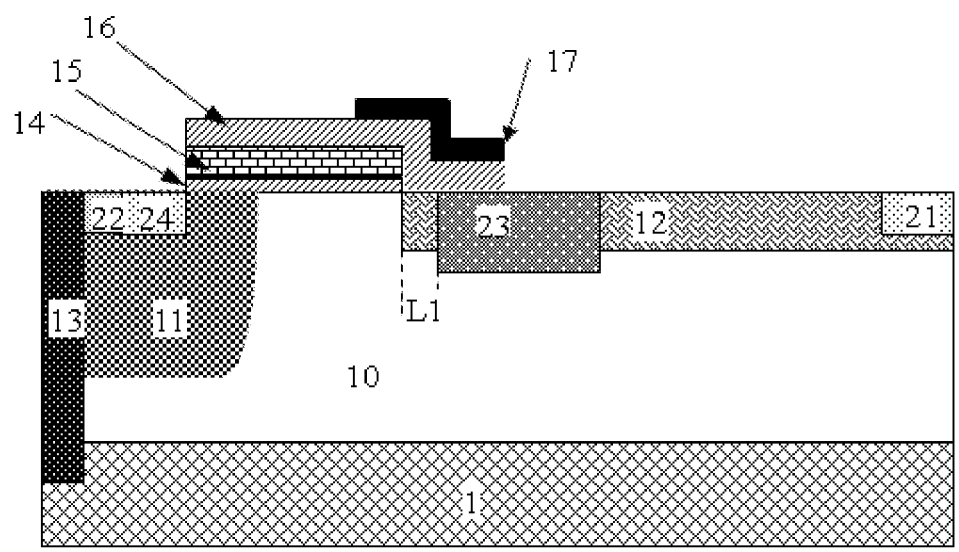
FIG. 2 shows a schematic illustration of an RF LDMOS device in accordance with Embodiment 1 of the present invention.

FIG. 2 shows an RF LDMOS device constructed in accordance with this embodiment.

As shown in FIG. 2, the RF LDMOS device includes a p-type epitaxial layer 10 over a p-type substrate 1.

Moreover, the RF LDMOS device further includes a p-type well 11 in a left portion of the p-type epitaxial layer 10 and a lightly doped n-type drain region 12 in a right portion of the p-type epitaxial layer 10. The p-type well 11 is not in contact with the light doped n-type drain region 12.

The RF LDMOS device further includes a heavily doped n-type source region 24 in an upper portion of the p-type well 11.

The RF LDMOS device further includes a heavily doped n-type drain region 21 in a right portion of the light doped n-type drain region 12.

The RF LDMOS device further includes a moderately doped n-type region 23 in a left portion of the light doped n-type drain region 12. The moderately doped n-type region 23 has a depth greater than that of the lightly doped n-type drain region 12. Preferably, a distance L1 between a left edge of the moderately doped n-type region 23 and a right edge of a polysilicon gate described in detail blow may be greater than or equal to 0.1 µm, and the moderately doped n-type region 23 has a depth of 0.1 µm to 0.5 µm greater than that of the lightly doped n-type drain region 12.

Moreover, the heavily doped n-type drain region 21 is not in contact with the moderately doped n-type region 23.

An n-type dopant concentration of the moderately doped n-type region 23 is lower than both n-type dopant concentrations of the heavily doped n-type drain region 21 and the heavily doped n-type source region 24 and is higher than or equal to an n-type dopant concentration of the lightly doped n-type drain region 12. Preferably, the n-type dopant may include phosphorus or arsenic. Additionally, both the heavily doped n-type regions 21, 24 have an n-type dopant concentration of 1E19 atoms/cm$^3$ to 1E21 atoms/cm$^3$. Moreover, the moderately doped n-type region 23 has an n-type dopant concentration of 5E17 atoms/cm$^3$ to 1E18 atoms/cm$^3$. Furthermore, the lightly doped n-type drain region 12 has an n-type dopant concentration of 1E15 atoms/cm$^3$ to 5E17 atoms/cm$^3$.

The RF LDMOS device may further include a contact column 13 connected to the p-type well 11 at the left edge of the p-type well 11, and the contact column 13 extends downwards into the p-type substrate 1.

The RF LDMOS device may further include a heavily doped p-type region 22 formed in an upper portion of the p-type well 11 left to the heavily doped n-type source region 24 and connected to the contact column 13. The heavily doped p-type region 22 has a p-type dopant concentration higher than the p-type well 11. Preferably, the heavily doped p-type region 22 may be doped with boron and has a boron concentration of 1E19 atoms/cm$^3$ to 1E21 atoms/cm$^3$.

The RF LDMOS device may further include a gate oxide layer 14 covering a portion of the p-type well 11 right to the heavily doped n-type source region 24 and a portion of the p-type epitaxial layer 10 between the p-type well 11 and the light doped n-type drain region 12.

The RF LDMOS device may further include: a polysilicon gate 15 covering the gate oxide layer 14; an oxide layer 16 covering both the polysilicon gate 15 and a left portion of the moderately doped n-type region 23; and a Faraday shield 17 covering a right portion of the oxide layer 16 and having a monolayer or multilayer structure.

Embodiment 2

Figure 3:
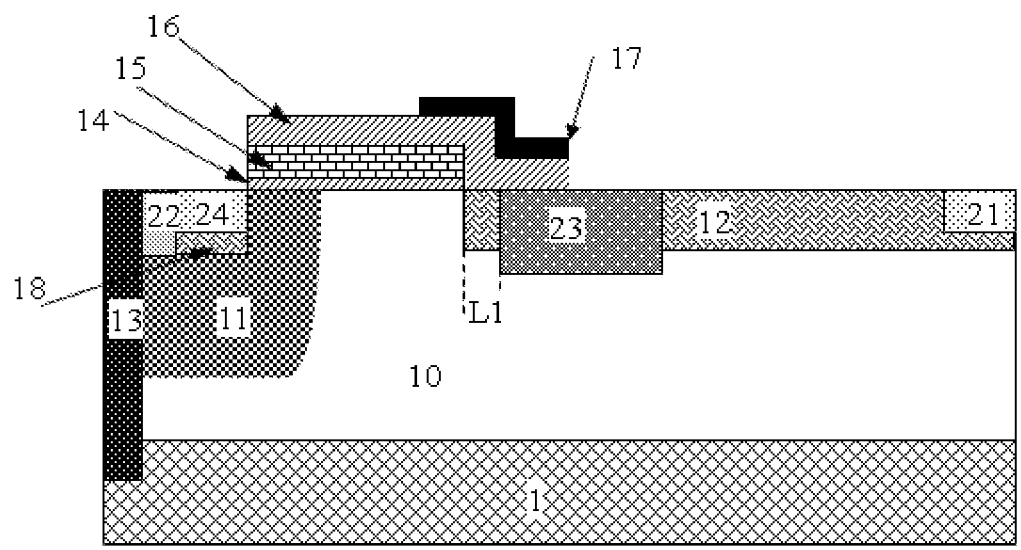
FIG. 3 shows a schematic illustration of an RF LDMOS device in accordance with Embodiment 2 of the present invention.

Referring to FIG. 3, an RF LDMOS device constructed in accordance with this embodiment differs from the RF LDMOS device of Embodiment 1 in further including a lightly doped n-type source region 18 under and in contact with the heavily doped n-type source region 24. The lightly doped n-type source region 18 has a lower n-type dopant concentration than the moderately doped n-type region 23. Preferably, in this embodiment, the N-type dopant may include phosphorus or arsenic, and the moderately doped n-type region 23 and the lightly doped n-type source region 18 have an n-type dopant concentration of 5E17 atoms/cm$^3$ to 1E18 atoms/cm$^3$ and of 1E15 atoms/cm$^3$ to 5E17 atoms/cm$^3$, respectively.

Embodiment 3

This embodiment provides a method of fabricating the RF LDMOS device of Embodiment 2. The method may include the steps described in detail below.

In a first step of the method, a p-type epitaxial layer 10 is grown over a p-type substrate 1.

In a second step, a p-type well 11 is formed in the p-type epitaxial layer 10 selectively by ion implantation and high temperature drive-in (ion activation).

Preferably, p-type boron ions may be implanted to form the p-type well 11 at a dose of 1E12 to 1E14 atoms/cm$^2$ with an energy of 30 KeV to 80 KeV; the high temperature drive-in may be performed at a temperature of 800° C. to 1200° C.

Figure 4:
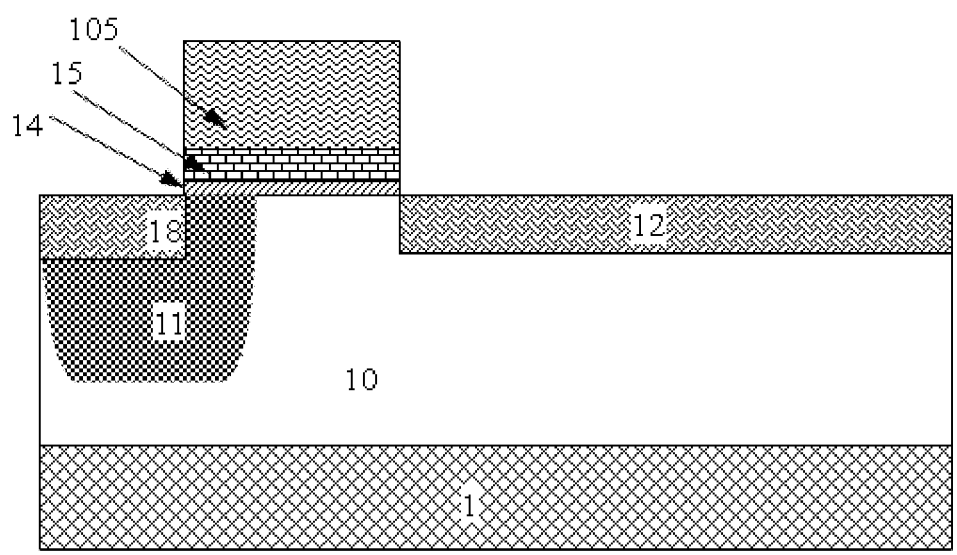
FIG. 4 shows a schematic illustration of a structure after a gate oxide layer, a polysilicon gate, a lightly doped n-type drain region and a lightly doped n-type source region are formed in an RF LDMOS device fabrication method in accordance with Embodiment 3 of the present invention.

In a third step, a gate oxide layer 14, a polysilicon gate 15, a lightly doped n-type drain region 12 and a lightly doped n-type source region 18 are formed. With reference to FIG. 4, a left portion of the gate oxide layer 14 covers a right portion of the p-type well 11, while a right portion of the gate oxide layer 14 covers a portion of the p-type epitaxial layer 10; the polysilicon gate 15 is covering the gate oxide layer 14; the lightly doped n-type drain region 12 is in a portion of the p-type epitaxial layer 10 right to the polysilicon gate 15; and the lightly doped n-type source region 18 is in a portion of the p-type well 11 left to the polysilicon gate 15.

Specifically, the gate oxide layer 14, the polysilicon gate 15, the lightly doped n-type drain region 12 and the lightly doped n-type source region 18 may be formed by a process comprising:

1) growing a gate oxide layer over the p-type epitaxial layer 10;
2) depositing polysilicon over the gate oxide layer;
3) defining an area where the polysilicon gate 15 is to be formed thereunder in a photoresist layer 105 in such a manner that a left portion of the defined area covers a right portion of the p-type well 11, and forming the gate oxide layer 14 and the polysilicon gate 15 by removing a portion of the photoresist layer 105 out of the defined area and removing a portion of each of the gate oxide layer and the polysilicon that is not covered by the remaining photoresist layer 105; and
4) performing a first light n-type ion implantation by using the remaining photoresist layer 105 on top of the formed polysilicon gate 15 as a mask to form the lightly doped n-type drain region 12 in the portion of the p-type epitaxial layer 10 right to the polysilicon gate 15 and the lightly doped n-type source region 18 in the portion of the p-type well 11 left to the polysilicon gate 15, wherein retaining the defined area of the photoresist layer 105 can prevent the underlying polysilicon gate 15 from being penetrated through during the ion implantation.

Preferably, in the first light n-type ion implantation, n-type phosphorus or arsenic ions may be implanted at a dose of 5E11 to 4E12 atoms/cm$^2$ with an energy of 50 KeV to 300 KeV.

Alternatively, the process discussed above may be substituted by another process including: growing a gate oxide layer over the p-type epitaxial layer 10; performing a first light n-type ion implantation to form the lightly doped n-type drain region 12 and the lightly doped n-type source region 18; depositing polysilicon over the gate oxide layer; and forming the gate oxide layer 14 and the polysilicon gate 15 by photolithography and etching. In this process, in the first light n-type ion implantation, n-type phosphorus or arsenic ions may be preferably implanted at a dose of 1E11 to 4E12 atoms/cm$^2$ with an energy of 50 KeV to 300 KeV.

Further, each of the two processes discussed above may be substituted by another process including: growing the lightly doped n-type drain region 12 and the lightly doped n-type source region 18 on the p-type epitaxial layer 10; growing a gate oxide layer and depositing polysilicon over the grown gate oxide layer; and forming the gate oxide layer 14 and the polysilicon gate 15 by photolithography and etching. Preferably, in this process, the grown lightly doped n-type drain region 12 and the grown lightly doped n-type source region 18 may both have a thickness of 0.1 μm to 1 μm and a bulk concentration of 1E14 to 1E17 atoms/cm$^3$.

Figure 5:
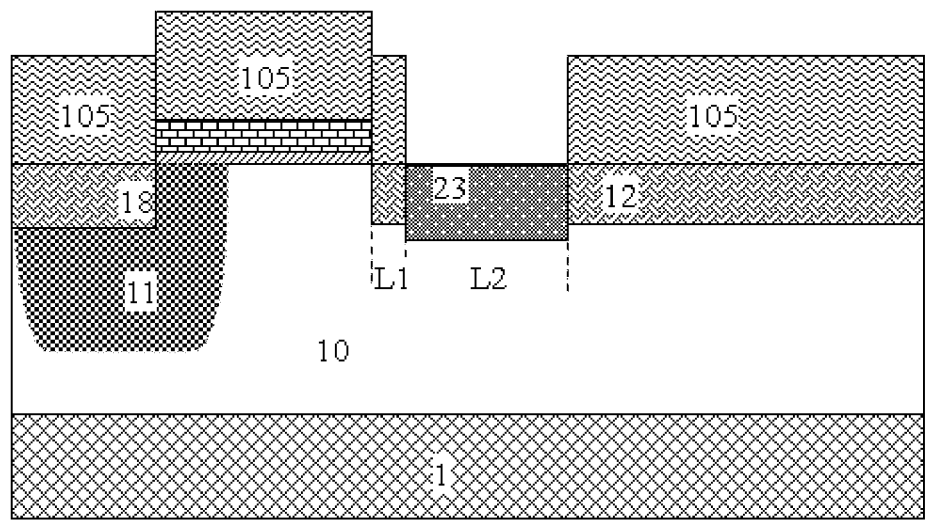
FIG. 5 shows a schematic illustration of a structure after a moderately doped n-type region is formed in the RF LDMOS device fabrication method in accordance with Embodiment 3 of the present invention.

In a fourth step of the method of this embodiment, an area where a moderately doped n-type region 23 is to be formed thereunder is defined in a photoresist layer 105. Next, a second light n-type ion implantation is formed, followed by a high temperature drive-in, to form the moderately doped n-type region 23 in a left portion of the lightly doped n-type drain region 12. Referring to FIG. 5, the moderately doped n-type region 23 has a depth greater than that of the lightly doped n-type drain region 12. The second light n-type ion implantation can result in a laterally non-uniform doping concentration distribution in the lightly doped n-type drain region 12.

Preferably, a distance L1 between a left edge of the formed moderately doped n-type region 23 and a right edge of the polysilicon gate 15 may be greater than or equal to 0.1 μm, and the moderately doped n-type region 23 has a depth of 0.1 μm to 0.5 μm greater than that of the lightly doped n-type drain region 12.

Preferably, the moderately doped n-type region 23 may have a length L2 of 0 μm to 4 μm.

Preferably, in the second light n-type ion implantation, n-type phosphorus or arsenic ions may be implanted at a dose of 5E11 to 4E12 atoms/cm$^2$ with an energy of 100 KeV to 300 KeV.

Preferably, the high temperature drive-in may be performed at a temperature of 800° C. to 1200° C.

In a fifth step of the method, an area where a heavily doped n-type source region 24 is to be formed thereunder and an area where a heavily doped n-type drain region 21 is to be formed thereunder are defined in a photoresist layer. After that, n-type dopant ions are implanted to form the heavily doped n-type source region 24 in a right portion of the lightly doped n-type source region 18 and the heavily doped n-type drain region 21 in a right portion of the lightly doped n-type drain region 12.

Next, an area where a heavily doped p-type region 22 is to be formed thereunder is further defined in the photoresist layer and p-type dopant ions are implanted to form the heavily doped p-type region 22 in a left portion of the lightly doped n-type source region 18.

Preferably, n-type phosphorus or arsenic ions may be implanted to form the heavily doped n-type source region 24 and the heavily doped n-type drain region 21 at a dose of 1E13 to 1E16 atoms/cm$^2$ with an energy of 0 KeV to 200 KeV.

Preferably, p-type boron or boron difluoride ions may be implanted to form the heavily doped p-type region 22 at a dose of 1E13 to 1E16 atoms/cm$^2$ with an energy 0 KeV to 100 KeV.

In a sixth step, subsequent processes are carried out to form an oxide layer 16, a Faraday shield 17 and a contact column 13, as shown in FIG. 3. The Faraday shield 17 may have a monolayer or multilayer structure.

Embodiment 4

This embodiment provides another method of fabricating the RF LDMOS device of Embodiment 2. The method may include the steps described in detail below.

In a first step, a p-type epitaxial layer 10 is grown over a p-type substrate 1.

Figure 6:
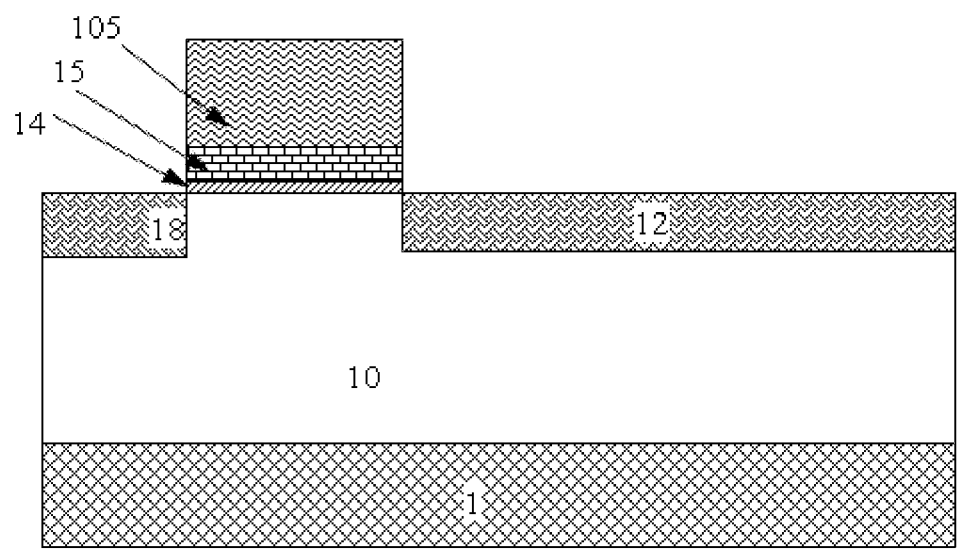
FIG. 6 shows a schematic illustration of a structure after a gate oxide layer, a polysilicon gate, a lightly doped n-type drain region and a lightly doped n-type source region are formed in a RF LDMOS device fabrication method in accordance with Embodiment 4 of the present invention.

In a second step, a gate oxide layer 14, a polysilicon gate 15, a lightly doped n-type drain region 12 and a lightly doped n-type source region 18 are formed. With reference to FIG. 6, the gate oxide layer 14 covers a portion of the p-type epitaxial layer 10; the polysilicon gate 15 is covering the gate oxide layer 14; the lightly doped n-type drain region 12 is in a portion of the p-type epitaxial layer 10 right to the polysilicon gate 15; the lightly doped n-type source region 18 is in a portion of the p-type epitaxial layer 10 left to the polysilicon gate 15.

Specifically, the gate oxide layer 14, the polysilicon gate 15, the lightly doped n-type drain region 12 and the lightly doped n-type source region 18 may be formed by a process comprising:

5) growing a gate oxide layer over the p-type epitaxial layer 10;
6) depositing polysilicon over the gate oxide layer;
7) defining an area where the polysilicon gate 15 is to be formed thereunder in a photoresist layer 105 and forming the gate oxide layer 14 and the polysilicon gate 15 by removing a portion of the photoresist layer 105 out of the defined area and removing a portion of each of the gate oxide layer and the polysilicon that is not covered by the remaining photoresist layer 105; and
8) performing a first light n-type ion implantation with by using the remaining photoresist layer 105 as a mask to form the lightly doped n-type drain region 12 in the portion of the p-type epitaxial layer 10 right to the polysilicon gate 15 and the lightly doped n-type source region 18 in the portion of the p-type epitaxial layer 10 left to the polysilicon gate 15, wherein retaining the defined area of the photoresist layer 105 can prevent the underlying polysilicon gate 15 from being penetrated through during the ion implantation.

Preferably, in the first light n-type ion implantation, n-type phosphorus or arsenic ions may be implanted at a dose of 5E11 to 4E12 atoms/cm$^2$ with an energy of 50 KeV to 300 KeV.

Alternatively, the process discussed above may be substituted by another process including: growing a gate oxide layer over the p-type epitaxial layer 10; performing a first light n-type ion implantation to form the lightly doped n-type drain region 12 and the lightly doped n-type source region 18; depositing polysilicon over the gate oxide layer; and forming the gate oxide layer 14 and the polysilicon gate 15 by photolithography and etching. In this process, in the first light n-type ion implantation, n-type phosphorus or arsenic ions may be preferably implanted at a dose of 1E11 to 4E12 atoms/cm$^2$ with an energy of 50 KeV to 300 KeV.

Further, each of the two processes discussed above may be substituted by another process including: growing the lightly doped n-type drain region 12 and the lightly doped n-type source region 18 on the p-type epitaxial layer 10; growing a gate oxide layer and depositing polysilicon over the grown gate oxide layer; and forming the gate oxide layer 14 and the polysilicon gate 15 by photolithography and etching. Preferably, in this process, the grown lightly doped n-type drain region 12 and the grown lightly doped n-type source region 18 may both have a thickness of 0.1 μm to 1 μm and a bulk concentration of 1E14 to 1E17 atoms/cm$^3$.

Figure 7:
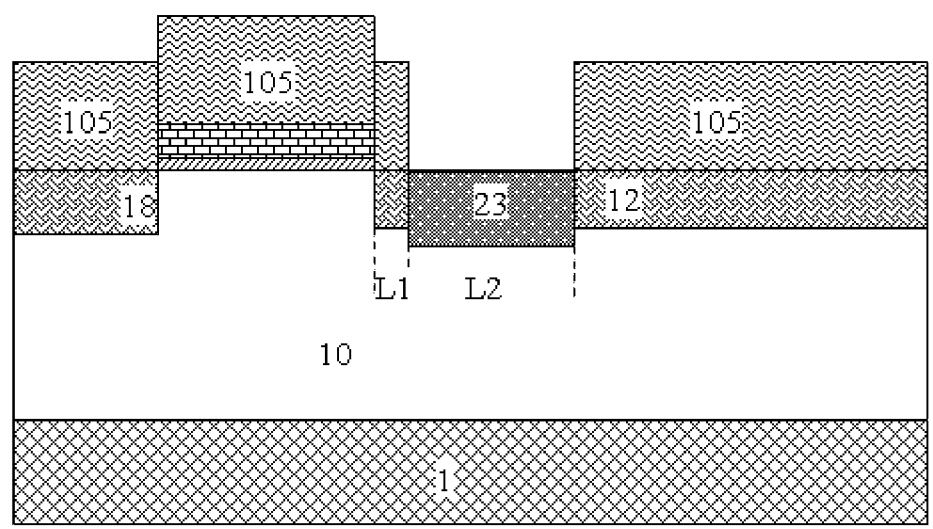
FIG. 7 shows a schematic illustration of a structure after a moderately doped n-type region is formed in the RF LDMOS device fabrication method in accordance with Embodiment 4 of the present invention.

In a third step of the method of this embodiment, an area where a moderately doped n-type region 23 is to be formed thereunder is defined on a photoresist layer. Next, a second light n-type ion implantation is formed, followed by a high temperature drive-in, to form the moderately doped n-type region 23 in a left portion of the lightly doped n-type drain region 12. Referring to FIG. 7, the moderately doped n-type region 23 has a depth greater than that of the lightly doped n-type drain region 12. The second light n-type ion implantation can result in a laterally non-uniform doping concentration distribution in the lightly doped n-type drain region 12.

Preferably, a distance L1 between a left edge of the formed moderately doped n-type region 23 and a right edge of the polysilicon gate 15 may be greater than or equal to 0.1 μm, and the moderately doped n-type region 23 has a depth of 0.1 μm to 0.5 μm greater than that of the lightly doped n-type drain region 12.

Preferably, the moderately doped n-type region 23 may have a length L2 of 0 μm to 4 μm.

Preferably, in the second light n-type ion implantation, n-type phosphorus or arsenic ions may be implanted at a dose of 5E11 to 4E12 atoms/cm$^2$ with an energy of 100 KeV to 300 KeV.

Preferably, the high temperature drive-in may be performed at a temperature of 800° C. to 1200° C.

In a fourth step of the method, p-type ions are implanted into a portion of the p-type epitaxial layer 10 under the lightly doped n-type source region 18, followed by high temperature drive-in (ion activation), to form a p-type well 11 therein selectively using a self-alignment technique.

Preferably, p-type boron ions may be implanted to form the p-type well 11 at a dose of 1E12 to 1E14 atoms/cm$^2$ with an energy of 30 KeV to 80 KeV, and the high temperature drive-in is performed at a temperature of 800° C. to 1200° C.

In a fifth step of the method, an area where a heavily doped n-type source region 24 is to be formed thereunder and an area where a heavily doped n-type drain region 21 is to be formed thereunder are defined in a photoresist layer. After that, n-type dopant ions are implanted to form the heavily doped n-type source region 24 in a right portion of the lightly doped n-type source region 18 and the heavily doped n-type drain region 21 in a right portion of the lightly doped n-type drain region 12.

Next, an area where a heavily doped p-type region 22 is to be formed thereunder is further defined in the photoresist layer and p-type dopant ions are implanted to form the heavily doped p-type region 22 in a left portion of the lightly doped n-type source region 18.

Preferably, n-type phosphorus or arsenic ions may be implanted to form the heavily doped n-type source region 24 and the heavily doped n-type drain region 21 at a dose of 1E13 to 1E16 atoms/cm$^2$ with an energy of 0 KeV to 200 KeV.

Preferably, p-type boron or boron difluoride ions may be implanted to form the heavily doped p-type region 22 at a dose of 1E13 to 1E16 atoms/cm$^2$ with an energy of 0 KeV to 100 KeV.

In a sixth step, subsequent processes are carried out to form an oxide layer 16, a Faraday shield 17 and a contact column 13, as shown in FIG. 3. The Faraday shield 17 may have a monolayer or multilayer structure.

As discussed above, the modification of the lateral doping concentration distribution in the lightly doped n-type drain region to a laterally non-uniform n-type dopant concentration distribution with a moderately n-type doped region, which has a higher doping concentration and a greater depth than the rest portion of the lightly doped n-type drain region, formed in a portion of the lightly n-type doped region proximate to the polysilicon gate enables the RF LDMOS device of the present invention to have both a high breakdown voltage and a significantly reduced on-resistance.

Moreover, in the RF LDMOS device fabrication method of the present invention, a second light n-type ion implantation additionally performed on a portion of the lightly doped n-type drain region in vicinity of the gate results in the formation of a moderately n-type doped region, which has a higher doping concentration and a greater depth than the rest portion of the lightly doped n-type drain region, proximate to the polysilicon gate. As this moderately n-type doped region is a certain distance away from the nearest edge of the polysilicon gate, it will not lead to the intensification of an electric field under the polysilicon gate and hence can enable the device maintain a higher breakdown voltage. In addition, as the moderately n-type doped region has a higher doping concentration and a greater depth, it can also enable the device to have a rather low on-resistance.

While preferred embodiments are described and illustrated above, they are not intended to limit the invention in any way. Various alternatives, modifications and variations may be made without departing from the scope of the invention. Thus, it is intended that the present invention embrace all such alternatives, modifications and variations as fall within the true scope of the invention.

What is claimed is:

1. A method of fabricating a radio frequency (RF) laterally diffused metal oxide semiconductor (LDMOS) device, comprising the steps of:
providing a substrate;
forming a p-type epitaxial layer over the substrate;
forming a p-type well in a first portion of the p-type epitaxial layer;
forming a lightly doped n-type drain region in a second portion of the p-type epitaxial layer, the lightly doped n-type drain region being separated from the p-type well;
forming a moderately doped n-type region in a first portion of the lightly doped n-type drain region, the moderately doped n-type region having a depth greater than a depth of the lightly doped n-type drain region;
forming a heavily doped n-type drain region in a second portion of the lightly doped n-type drain region, the heavily doped n-type drain region being separated from the moderately doped n-type region; and
forming a heavily doped n-type source region in an upper portion of the p-type well,
wherein an n-type dopant concentration of the moderately doped n-type region is lower than both n-type dopant concentrations of the heavily doped n-type drain region and the heavily doped n-type source region and is higher than or equal to an n-type dopant concentration of the lightly doped n-type drain region.

2. The method according to claim 1, comprising the following steps in the sequence set forth:
1) growing a p-type epitaxial layer over a p-type substrate;
2) forming a p-type well in the p-type epitaxial layer;
3) forming a gate oxide layer, a polysilicon gate, a lightly doped n-type drain region and a lightly doped n-type source region, the gate oxide layer covering a portion of the p-type well and a portion of the p-type epitaxial layer, the polysilicon gate covering the gate oxide layer, the lightly doped n-type source region being formed at least in a portion of the p-type well on a first side of the gate oxide layer, the lightly doped n-type drain region being formed in a portion of the p-type epitaxial layer on a second side of the gate oxide layer;
4) forming a moderately doped n-type region in a first portion of the lightly doped n-type drain region, the moderately doped n-type region having a depth greater than a depth of the lightly doped n-type drain region;
5) forming a heavily doped p-type region, a heavily doped n-type source region and a heavily doped n-type drain region, the heavily doped p-type region being formed in a first portion of the lightly doped n-type source region, the heavily doped n-type source region being formed in a second portion of the lightly doped n-type source region, the heavily doped n-type drain region being formed in a second portion of the lightly doped n-type drain region; and
6) forming an oxide layer, at least one Faraday shield and a contact column.

3. The method according to claim 2, wherein in the step 2), the p-type well is formed in the p-type epitaxial layer by implanting p-type dopant ions followed by high temperature drive-in.

4. The method according to claim 3, wherein the p-type dopant ions are boron ions and are implanted at a dose of 1E12 to 1E14 atoms/cm$^2$ and an energy of 30 KeV to 80 KeV, and wherein the high temperature drive-in is performed at a temperature of 800° C. to 1200° C.

5. The method according to claim 2, wherein the moderately doped n-type region has a length of 0 μm to 4 μm, wherein a distance between the moderately doped n-type region and the polysilicon gate is greater than or equal to 0.1 μm, and wherein the depth of the moderately doped n-type region is 0.1 μm to 0.5 μm greater than the depth of the lightly doped n-type drain region.

6. The method according to claim 2, wherein in the step 4), the lightly doped n-type drain region is formed by implanting n-type phosphorus or arsenic ions at a dose of 5E11 to 4E12 atoms/cm$^2$ and an energy of 100 KeV to 300 KeV.

7. The method according to claim 2, wherein in the step 5), both the heavily doped n-type source region and the heavily doped n-type drain region are formed by implanting n-type phosphorus or arsenic ions at a dose of 1E13 to 1E16 atoms/cm$^2$ and an energy of 0 KeV to 200 KeV, and the heavily doped p-type region is formed by implanting p-type boron or boron difluoride ions at a dose of 1E13 to 1E16 atoms/cm$^2$ and an energy of 0 KeV to 100 KeV.

8. The method according to claim 1, comprising the following steps in the sequence set forth:
1) growing a p-type epitaxial layer over a p-type substrate;
2) forming a gate oxide layer, a polysilicon gate, a lightly doped n-type drain region and a lightly doped n-type source region, the gate oxide layer covering a portion of the p-type epitaxial layer, the polysilicon gate covering the gate oxide layer, the lightly doped n-type source region being formed in the p-type epitaxial layer and on a first side of the polysilicon gate, the lightly doped n-type drain region being formed in the p-type epitaxial layer and on a second side of the gate oxide layer;
3) forming a moderately doped n-type region in a first portion of the lightly doped n-type drain region, the moderately doped n-type region having a depth greater than a depth of the lightly doped n-type drain region;
4) forming a p-type well in the p-type epitaxial layer and under the lightly doped n-type source region;
5) forming a heavily doped p-type region, a heavily doped n-type source region and a heavily doped n-type drain region, the heavily doped p-type region being formed in a first portion of the lightly doped n-type source region, the heavily doped n-type source region being formed in a second portion of the lightly doped n-type source region, the heavily doped n-type drain region being formed in a second portion of the lightly doped n-type drain region;
and
6) forming an oxide layer, at least one Faraday shield and a contact column.

9. The method according to claim 8, wherein the moderately doped n-type region has a length of 0 μm to 4 μm, wherein a distance between the moderately doped n-type region and the polysilicon gate is greater than or equal to 0.1 μm, and wherein the depth of the moderately doped n-type region is 0.1 μm to 0.5 μm greater than the depth of the lightly doped n-type drain region.

10. The method according to claim 8, wherein in the step 3), the lightly doped n-type drain region is formed by implanting n-type phosphorus or arsenic ions at a dose of 5E11 to 4E12 atoms/cm$^2$ and an energy of 100 KeV to 300 KeV.

11. The method according to claim 8, wherein in the step 4), the p-type well is formed in the p-type epitaxial layer by implanting p-type dopant ions followed by high temperature drive-in.

12. The method according to claim 11, wherein the p-type dopant ions are boron ions and are implanted at a dose of 1E12 to 1E14 atoms/cm$^2$ and an energy of 30 KeV to 80 KeV, and wherein the high temperature drive-in is performed at a temperature of 800° C. to 1200° C.

13. The method according to claim 8, wherein in the step 5), both the heavily doped n-type source region and the heavily doped n-type drain region are formed by implanting n-type phosphorus or arsenic ions at a dose of 1E13 to 1E16 atoms/cm$^2$ and an energy of 0 KeV to 200 KeV, and the heavily doped p-type region is formed by implanting p-type boron or boron difluoride ions at a dose of 1E13 to 1E16 atoms/cm$^2$ and an energy of 0 KeV to 100 KeV.

* * * * *